US012673575B2

(12) United States Patent (10) Patent No.: US 12,673,575 B2
Itakura et al. (45) Date of Patent: Jul. 7, 2026

(54) BATTERY ABNORMALITY PREDICTION NOTIFICATION SYSTEM, BATTERY ABNORMALITY PREDICTION SYSTEM, BATTERY ABNORMALITY PREDICTION METHOD, AND NON-TRANSITORY RECORDING MEDIUM STORING BATTERY ABNORMALITY PREDICTION PROGRAM

(71) Applicant: Panasonic Intellectual Property Management Co., Ltd., Osaka (JP)

(72) Inventors: Yusuke Itakura, Nara (JP); Mutsuhiko Takeda, Kyoto (JP); Shinya Nishikawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 258 days.

(21) Appl. No.: 18/510,738

(22) Filed: Nov. 16, 2023

(65) Prior Publication Data

US 2024/0083283 A1 Mar. 14, 2024

Related U.S. Application Data

(63) Continuation of application No. PCT/JP2022/020373, filed on May 16, 2022.

(30) Foreign Application Priority Data

May 28, 2021 (JP) ................................. 2021-090032

(51) Int. Cl.
 B60L 53/62 (2019.01)
 B60L 53/68 (2019.01)
 (Continued)

(52) U.S. Cl.
 CPC .............. B60L 53/62 (2019.02); B60L 53/68 (2019.02); G01R 31/374 (2019.01);
 (Continued)

(58) Field of Classification Search
 CPC ........... B60L 2240/549; B60L 2240/70; B60L 2240/80; B60L 2260/50; B60L 3/0023;
 (Continued)

(56) References Cited

U.S. PATENT DOCUMENTS

| 9,454,888 B2 * | 9/2016 | Xie ........................ G08B 29/181 |
| 12,352,788 B2 * | 7/2025 | Wang ................... G01R 19/003 |
| (Continued) | | |

FOREIGN PATENT DOCUMENTS

| JP | 2008-204867 | 9/2008 |
| JP | 2009-264779 | 11/2009 |
| JP | 2020-045668 A | 3/2020 |

OTHER PUBLICATIONS

The EPC Office Action dated Sep. 11, 2024 for the related European Patent Application No. 22811189.4.

(Continued)

*Primary Examiner* — Anne Marie Antonucci
*Assistant Examiner* — Jodi Jones
(74) *Attorney, Agent, or Firm* — Rimon P.C.

(57) ABSTRACT

In a battery abnormality prediction system, an acquisition unit acquires a current flowing through a battery and a temperature of the battery. A prediction unit predicts the occurrence of an abnormality in the battery, based on a relationship between the amount of the current flowing through the battery for a certain period of time and a rise in the temperature of the battery for the certain period of time. The prediction unit may compare the ratio of an integrated amount of current to the temperature rise for the certain period of time with a threshold determined based on data on the battery having caught fire and thereby predict a sign of fire to be caught by the battery.

18 Claims, 9 Drawing Sheets

(51) Int. Cl.

| | |
|---|---|
| *G01R 31/374* | (2019.01) |
| *G01R 31/382* | (2019.01) |
| *G07C 5/00* | (2006.01) |
| *H01M 10/42* | (2006.01) |
| *H01M 10/44* | (2006.01) |
| *H01M 10/48* | (2006.01) |
| *H02J 7/80* | (2026.01) |

(52) U.S. Cl.

CPC ........... *G01R 31/382* (2019.01); *G07C 5/008* (2013.01); *H01M 10/425* (2013.01); *H01M 10/44* (2013.01); *H01M 10/486* (2013.01); *H02J 7/80* (2026.01); *H01M 2010/4278* (2013.01); *H01M 2220/20* (2013.01)

(58) Field of Classification Search

CPC .......... B60L 3/0046; B60L 3/12; B60L 53/65; B60L 58/16; B60L 58/21; B60L 58/24; B60L 2240/545; H01M 10/42; H01M 10/48; H01M 10/425; H01M 10/44; H01M 10/486; H01M 2010/4278; H01M 2220/20; Y02E 60/10; G01R 31/374; G01R 31/382; G01R 31/36; G01R 31/392; G07C 5/008; H02J 7/0047

USPC ........ 701/31.4, 1, 36, 33.4, 2, 29.1; 320/134, 320/109, 107, 132, 136, 137, 162, 112, 320/104; 702/63, 183, 182, 64, 65, 130, 702/85, 185, 108, 127

See application file for complete search history.

(56) References Cited

U.S. PATENT DOCUMENTS

| | | | | |
|---|---|---|---|---|
| 2011/0050175 | A1* | 3/2011 | Odaohhara | H02J 7/663 |
| | | | | 320/136 |
| 2012/0130661 | A1* | 5/2012 | Hagimori | G01R 31/3842 |
| | | | | 702/63 |
| 2013/0140886 | A1* | 6/2013 | Bito | B60L 3/0046 |
| | | | | 307/10.7 |
| 2014/0152445 | A1* | 6/2014 | Krieg | B60L 58/21 |
| | | | | 340/584 |
| 2018/0069274 | A1* | 3/2018 | Matsubara | B60L 3/0046 |
| 2020/0355749 | A1* | 11/2020 | Takahashi | G01R 31/3842 |
| 2021/0245627 | A1* | 8/2021 | Ferguson | G05D 1/0291 |
| 2021/0286017 | A1* | 9/2021 | Hom | G01R 31/367 |
| 2022/0021037 | A1* | 1/2022 | Balazs | H01M 10/482 |
| 2022/0052389 | A1* | 2/2022 | Kwon | G01R 31/392 |
| 2022/0126698 | A1* | 4/2022 | Roh | A62C 3/07 |

OTHER PUBLICATIONS

International Search Report of PCT application No. PCT/JP2022/020373 dated Jul. 26, 2022.

* cited by examiner

Normal battery

Determination score

Threshold

Time

Battery before catching fire

Determination score                                Occurrence of fire

Threshold

Time

BATTERY ABNORMALITY PREDICTION NOTIFICATION SYSTEM, BATTERY ABNORMALITY PREDICTION SYSTEM, BATTERY ABNORMALITY PREDICTION METHOD, AND NON-TRANSITORY RECORDING MEDIUM STORING BATTERY ABNORMALITY PREDICTION PROGRAM

BACKGROUND

Technical Field

The present disclosure relates to a battery abnormality prediction notification system, a battery abnormality prediction system, a battery abnormality prediction method, and a battery abnormality prediction program, each being configured to predict abnormal heat generation in a battery.

Description of the Related Art

When a secondary battery is charged, measures against thermal runaway caused by self-heat generation or the like need to be taken. For example, a method has been proposed in which the temperature of a battery is detected at predetermined time intervals and whether an abnormal temperature rise has occurred is determined based on a temperature difference or a temperature rise rate, and, in the case where an abnormal temperature rise has occurred, charging is interrupted (for example, see Patent Literature 1).

CITATION LIST

Patent Literature 1: Japanese Unexamined Patent Application Publication No. 2008-204867

SUMMARY

In the above-mentioned method, the temperature difference or the temperature rise rate is calculated at the timing set from the start of charging, whereby whether an abnormality has occurred is determined. Furthermore, an allowable range of temperature change is determined on the assumption of a normal charging pattern. Therefore, in the case where a temperature rise during charging is not greater than assumed, it is basically determined that no abnormality has occurred. When charging is performed with a different pattern from the normal charging pattern, determining an abnormality is difficult because a temperature change pattern is different from a normal one. Furthermore, in the case of a small temperature change during charging, there is a risk of overlooking a sign of abnormal heat generation.

The present disclosure has been made in view of these circumstances, and an object of the present disclosure is to provide techniques of early detecting a sign of abnormal heat generation in a battery.

To solve the above-described problem, a battery abnormality prediction system according to one aspect of the present disclosure includes: an acquisition unit configured to acquire a current flowing through a battery and a temperature of the battery; and a prediction unit configured to predict the occurrence of an abnormality in the battery, based on a relationship between the amount of the current flowing through the battery for a certain period of time and a rise in the temperature of the battery for the certain period of time.

Note that any combination of the above-mentioned constituents, and what is obtained by converting expressions in the present disclosure between a device, a method, a system, a computer program, a recording medium, and the like are also effective as aspects of the present disclosure.

According to the present disclosure, a sign of abnormal heat generation in a battery can be early detected.

DETAILED DESCRIPTIONS

Figure 1:
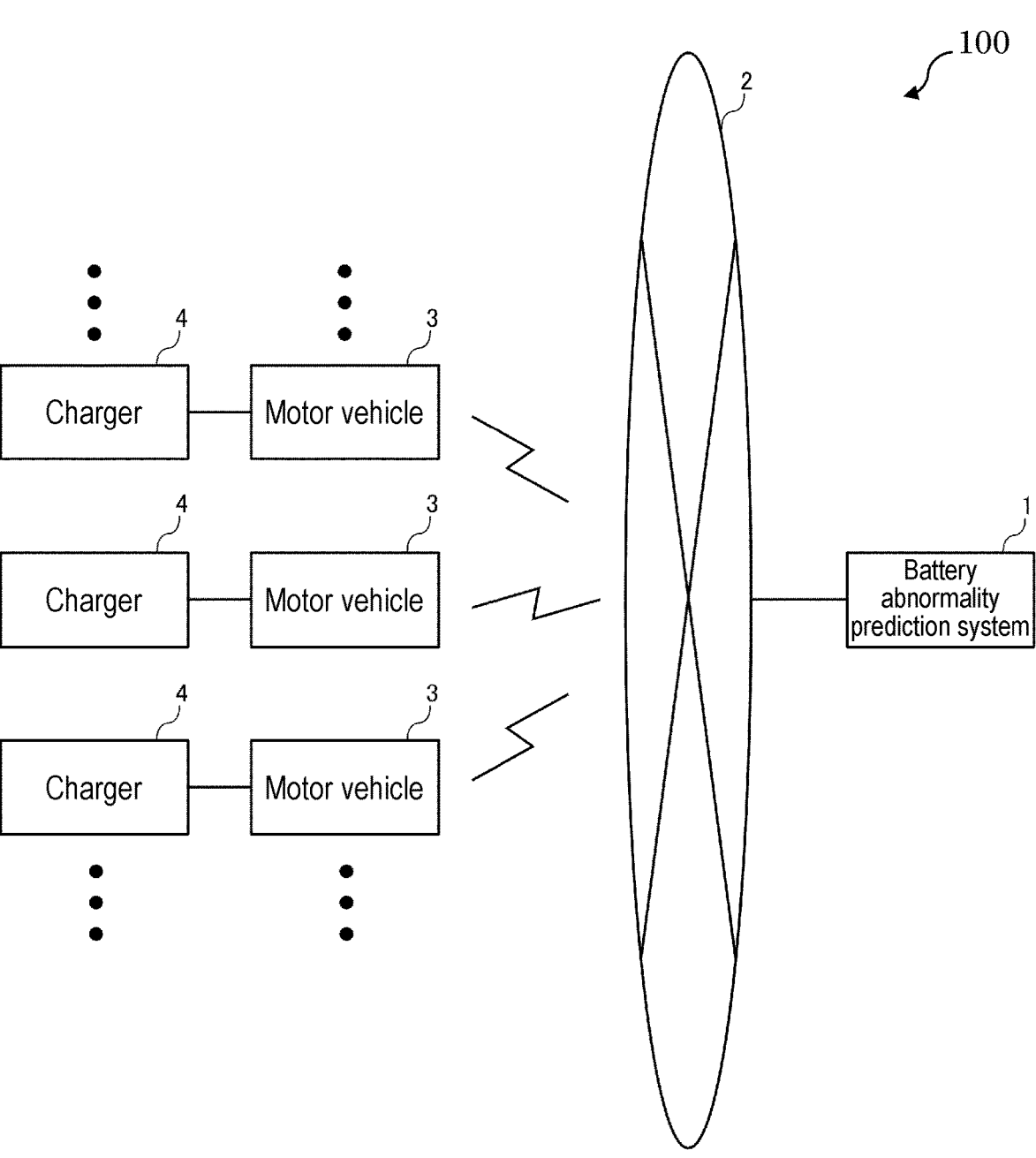
FIG. 1 a schematic diagram of a battery abnormality prediction notification system according to an embodiment.

FIG. 1 a schematic diagram of battery abnormality prediction according to an embodiment. Battery abnormality prediction notification system 100 is a system configured to provide notification of a battery abnormality prediction. Battery abnormality prediction notification system 100 according to an embodiment connects battery abnormality prediction system 1 and motor vehicle 3 via network 2. Battery abnormality prediction system 1 according to the embodiment is a system configured to detect a sign of abnormal heat generation in a secondary battery installed in motor vehicle 3. Examples of motor vehicle 3 include electric vehicles (EV), plug-in hybrid vehicles (PHV), and hybrid vehicles (HV). In the embodiment, a pure EV is assumed as motor vehicle 3.

Battery abnormality prediction system 1 according to the embodiment is a system used by at least one delivery company. For example, battery abnormality prediction system 1 may be constructed on a company-owned server installed in a company-owned facility or a data center of a service provider entity that offers operation management support service for motor vehicle 3. Alternatively, battery abnormality prediction system 1 may be constructed on a cloud server to be used based on a cloud service contract. Alternatively, battery abnormality prediction system 1 may be constructed on a plurality of servers separately installed in a plurality of respective bases (a data center, a company owned facility). The servers may be any of a combination of a plurality of company-owned servers, a combination of a plurality of cloud servers, and a combination of a company-owned server and a cloud server.

The delivery company possesses a plurality of motor vehicles 3 and a plurality of chargers 4 and utilizes motor vehicles 3 for delivery business. Note that motor vehicles 3 can be charged by charger 4 other than charger 4 provided in a delivery base.

Motor vehicles 3 each have a wireless communication function and can be connected to network 2 connected to battery abnormality prediction system 1. Motor vehicle 3 is capable of transmitting battery data on an on-board secondary battery to battery abnormality prediction system 1 via network 2.

Network 2 is a general term for channels, such as the Internet, leased lines, and a virtual private network (VPN), and any communication medium and communication protocol can be used for network 2. Examples of the communication medium that can be used include cellular phone networks (cellular networks), wireless LAN, cable LAN, optical fiber networks, ADSL networks, and CATV networks. Examples of the communication protocol that can be used include transmission control protocols (TCP)/internet protocols (IP), user datagram protocols (UDP)/IP, and Ethernet (registered trademark).

Figure 2:
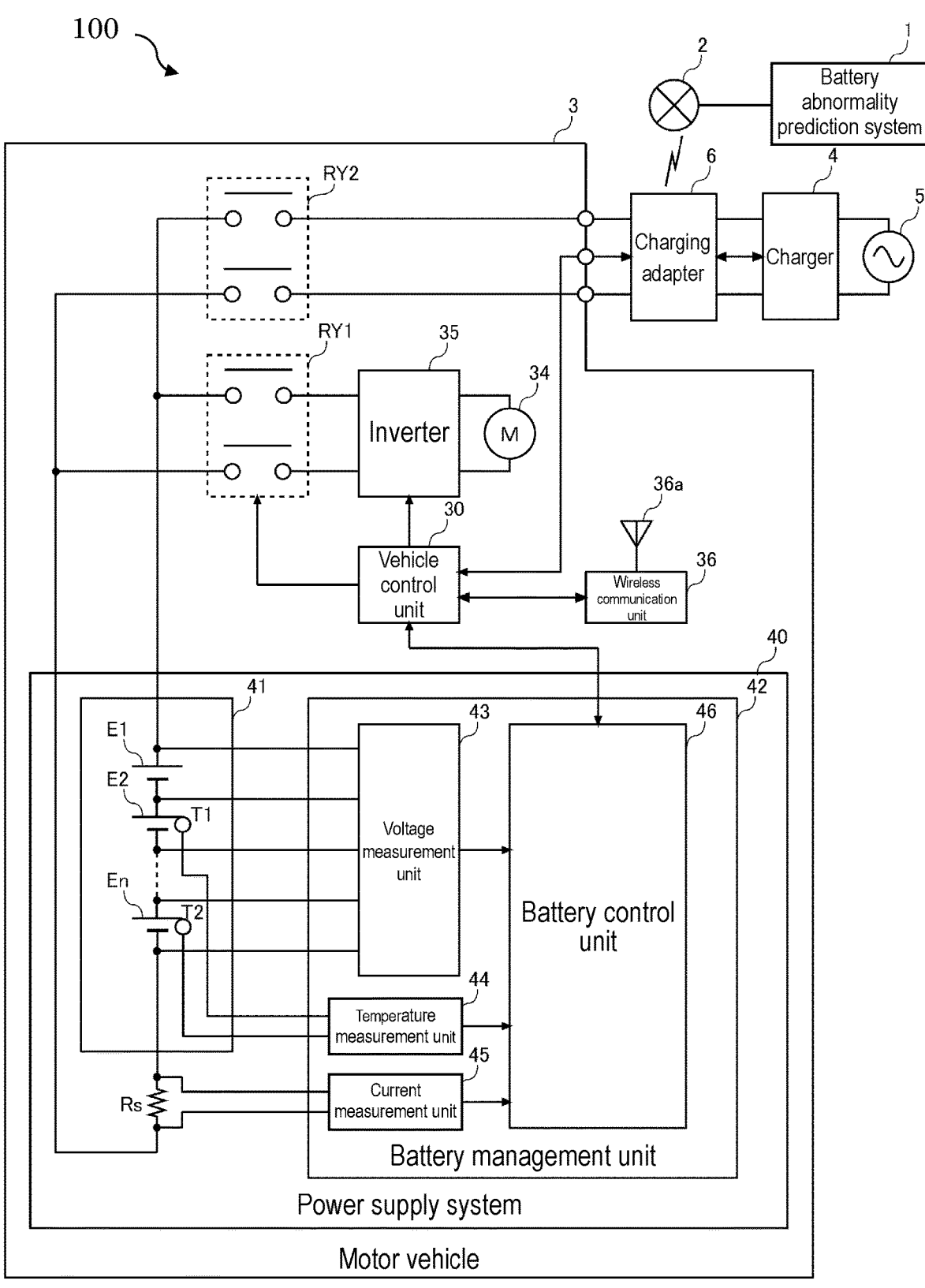
FIG. 2 is a diagram for explaining a detailed configuration of a power supply system installed in a motor vehicle.

FIG. 2 is a diagram for explaining a detailed configuration of power supply system 40 installed in motor vehicle 3. Power supply system 40 is connected to motor 34 via first relay RY1 and inverter 35. At the time of powering, inverter 35 converts direct current (DC) power supplied from power supply system 40 into alternating current (AC) power and supplies the AC power to motor 34. At the time of regeneration, inverter 35 converts AC power supplied from motor 34 into DC power and supplies the DC power to power supply system 40. Motor 34 is a three-phase AC motor and rotates in accordance with the AC power supplied from inverter 35 at the time of powering. At the time of regeneration, motor 34 converts rotational energy caused by speed reduction into AC power and supplies the AC power to inverter 35.

Vehicle control unit 30 is a vehicle electronic control unit (ECU) configured to control the entirety of motor vehicle 3 and may be configured with an integrated vehicle control module (VCM), for example. Wireless communication unit 36 performs signal processing for establishing wireless connection with network 2 via antenna 36a. Examples of a wireless communication network allowing motor vehicle 3 to establish wireless connection therewith that can be used include cellular-phone networks (cellular network), wireless LAN, vehicle-to-infrastructure (V2I), vehicle-to-vehicle (V2V), electronic toll collection (ETC) systems, and dedicated short range communications (DSRC).

First relay RY1 is a contactor interposed in wiring connecting between power supply system 40 and inverter 35. Vehicle control unit 30 controls first relay RY1 to an ON state (a closed state) during running and thereby electrically connect power supply system 40 to a power system of motor vehicle 3. Vehicle control unit 30 basically controls first relay RY1 to an OFF state (an open state) during non-running and thereby electrically interrupts the connection between power supply system 40 and the power system of motor vehicle 3. Note that, instead of the relay, other types of switches, such as a semiconductor switch, may be used.

When connected to charger 4, motor vehicle 3 can externally charge battery module 41 disposed in power supply system 40. In the present embodiment, motor vehicle 3 is connected to charger 4 via charging adapter 6. Charging adapter 6 is, for example, mounted onto an end of a terminal of charger 4. When charging adapter 6 is mounted onto charger 4, a control unit in charging adapter 6 establishes a communication channel with a control unit in charger 4.

Charging adapter 6 is preferably configured with a small casing. In this case, a driver of motor vehicle 3 can easily carry charging adapter 6 and thereby mount and use charging adapter 6 also onto charger 4 other than charger 4 provided in a delivery base. For example, charging adapter 6 can be mounted onto charger 4 and used, charger 4 being provided in a public facility, a commercial facility, a gas station, a car dealer, or an expressway service area, as charger 4 other than charger 4 provided in the delivery base.

When charging adapter 6 mounted onto charger 4 and is connected to motor vehicle 3 by a charging cable, charger 4 can charge battery module 41 disposed in motor vehicle 3. Charging adapter 6 passes electric power supplied from charger 4 through motor vehicle 3. Charging adapter 6 has a wireless communication function and is thereby capable of transmitting and receiving data to and from battery abnormality prediction system 1 via network 2. Charging adapter 6 functions as a gateway that relays communications between motor vehicle 3 and charger 4, between motor vehicle 3 and battery abnormality prediction system 1, and between charger 4 and battery abnormality prediction system 1.

Charger 4 is connected to commercial power system 5 to charge power supply system 40 disposed in motor vehicle 3. In motor vehicle 3, second relay RY2 is interposed in wiring connecting between power supply system 40 and charger 4. Note that, instead of the relay, other types of switches, such as a semiconductor switch, may be used. Battery management unit 42 controls second relay RY2 to an ON state directly or via vehicle control unit 30 before the start of charging, and controls second relay RY2 to an OFF state after the completion of charging.

Generally, normal charging is performed with an alternating current, whereas boosting charging is performed with a direct current. In the case of charging with an alternating current (for example, single phase 100/200V), AC power is converted into DC power by an AC/DC converter (not illustrated) interposed between second relay RY2 and power supply system 40. In the case of charging with a direct current, charger 4 performs full-wave rectification of AC power supplied from commercial power system 5 and smooths the AC power with a filter to generate DC power.

As a boosting charge standard, for example, CHAdeMO (registered trademark), ChaoJi, GB/T or a combined charging system (Combo) can be used. In CHAdeMO 2.0, the maximum output (specification) is defined as 1000 V×400 A=400 kW. In CHAdeMO 3.0, the maximum output (specification) is defined as 1500 V×600 A=900 kW. In ChaoJi, the maximum output (specification) is defined as 1500 V×600 A=900 kW. In GB/T, the maximum output (specification) is defined as 750 V×250 A=185 kW. In Combo, the maximum output (specification) is defined as 900 V×400 A=350 kW. In CHAdeMO, ChaoJi, and GB/T, a controller area network (CAN) is used as a communication mode. In Combo, power line communication (PLC) is used as a communication mode.

A charging cable for which the CAN is used includes not only a power line but also a communication line. When charging adapter 6 is connected to motor vehicle 3 by the charging cable, vehicle control unit 30 establishes a communication channel with the control unit disposed in charging adapter 6. Note that, in the charging cable for which the PLC is used, a communication signal is superimposed onto the power line and transmitted.

Vehicle control unit 30 establishes a communication channel with battery management unit 42 via an in-vehicle network (for example, CAN or a local interconnect network (LIN)). In the case where a telecommunications standard between vehicle control unit 30 and the control unit disposed in charging adapter 6 is different from a telecommunications standard between vehicle control unit 30 and battery management unit 42, vehicle control unit 30 functions as a gateway.

Power supply system 40 installed in motor vehicle 3 includes battery module 41 and battery management unit 42. Battery module 41 includes a plurality of cells E1 to En connected in series. Battery module 41 may include a plurality of cells connected in series-parallel. Battery module 41 may include a combination of a plurality of battery modules. Examples of the cell that can be used may include lithium-ion battery cells, nickel-metal hydride battery cells, and lead battery cells. Hereinafter, in the present specification, an example in which lithium-ion battery cells (nominal voltage: 3.6 to 3.7 V) are used will be described. The number of cells E1 to En connected in series is determined in accordance with the driving voltage of motor 34.

Shunt resistance Rs is connected to cells E1 to En in series. Shunt resistance Rs functions as a current detecting element. Instead of shunt resistance Rs, a Hall element may be used. A plurality of temperature sensors T1, T2 for detecting the temperatures of cells E1 to En is disposed inside battery module 41. One temperature sensor may be disposed in the battery module, or alternatively one temperature sensor may be disposed in every group of a plurality of the cells. For example, a thermistor can be used for temperature sensors T1, T2.

Battery management unit 42 includes voltage measurement unit 43, temperature measurement unit 44, current measurement unit 45, and battery control unit 46. Nodes of cells E1 to En connected in series are connected to voltage measurement unit 43 by a plurality of voltage wires. Voltage measurement unit 43 measures voltages between every two adjoining voltage wires to measure the voltages of cells E1 to En. Voltage measurement unit 43 transmits the measured voltages of cells E1 to En to battery control unit 46.

Since voltage measurement unit 43 has higher pressure than battery control unit 46, voltage measurement unit 43 and battery control unit 46 are connected by a communication line, while being insulated from each other. Voltage measurement unit 43 can be configured with an application specific integrated circuit (ASIC) or a general-purpose analog-front-end IC. Voltage measurement unit 43 includes a multiplexer and an A/D converter. The multiplexer outputs voltages between every two adjoining voltage wires to the A/D converter in the order from top to bottom. The A/D converter converts the analog voltages inputted from the multiplexer into digital values.

Temperature measurement unit 44 includes a plurality of voltage dividing resistors and an A/D converter. The A/D converter sequentially converts a plurality of analog voltages voltage-divided by temperature sensors T1, T2 and the voltage dividing resistors into digital values and outputs the digital values to battery control unit 46. Battery control unit 46 estimates temperatures of cells E1 to En, based on the digital values. For example, battery control unit 46 estimates the temperature of each of cells E1 to En, based on a value measured by any of the temperature sensors that is closest to each of cells E1 to En.

Current measurement unit 45 includes a differential amplifier and an A/D converter. The differential amplifier amplifies voltages on both ends of shunt resistance Rs and outputs the amplified voltages to the A/D converter. The A/D converter converts the analog voltages inputted from the differential amplifier into digital values and outputs the digital values to battery control unit 46. Battery control unit 46 estimates a current flowing through cells E1 to En, based on the digital values.

In the case where the A/D converter is installed in battery control unit 46 and an analog input port is provided in battery control unit 46, temperature measurement unit 44 and current measurement unit 45 may output the analog voltages to battery control unit 46 and convert the analog voltages into digital values by using the A/D converter disposed in battery control unit 46.

Battery control unit 46 manages the states of cells E1 to En, based on voltages, temperatures, and currents of cells E1 to En measured by voltage measurement unit 43, temperature measurement unit 44, and current measurement unit 45, respectively. When an overvoltage, too-low voltage, overcurrent, or temperature abnormality occurs in at least one of cells E1 to En, battery control unit 46 turns off second relay RY2 or a protective relay (not illustrated) disposed in battery module 41 and thereby protects the cell.

Battery control unit 46 can include a microcontroller and a nonvolatile memory (for example, an electrically erasable programmable read-only memory (EEPROM) or a flash memory). Battery control unit 46 estimates SOC, a full charge capacity (FCC), and a state of health (SOH) of each of cells E1 to En.

Battery control unit 46 estimates an SOC in combination of an open circuit voltage (OCV) method and a current integration method. The OCV method is a method of estimating an SOC, based on an OCV of each of cells E1 to En measured by voltage measurement unit 43 and an SOC-OCV curve of cells E1 to En. The SOC-OCV curve of cells E1 to En is beforehand created based on a characteristic test performed by a battery maker and registered in an internal memory of the microcontroller at the time of shipment.

The current integration method is a method of estimating an SOC, based on an OCV of each of cells E1 to En at the start of charge-and-discharge and an integrated value of currents measured by current measurement unit 45. In the current integration method, as the time for charge-and-discharge is longer, the cumulative amount of measurement errors by current measurement unit 45 is larger. Therefore, an SOC estimated by the current integration method is preferably corrected using an SOC estimated by the OCV method.

Battery control unit 46 is capable of estimating a full charge capacity (FCC) by dividing an integrated values of currents flowing in a period from the start of charge-and-discharge to the end thereof by an SOC change in the period. An SOC at the start of charge-and-discharge and an SOC at the end of charge-and-discharge can be determined from the measured OCV and SOC-OCV curve.

The SOH is defined by a ratio of a present FCC to an initial FCC, and a smaller SOH value (a value closer to 0%) indicates the progress of deterioration.

Battery control unit 46 transmits the voltages, currents, temperatures, SOCs, FCCs, and SOHs of cells E1 to En to vehicle control unit 30 via the in-vehicle network.

Vehicle control unit 30 is capable of transmitting battery data to battery abnormality prediction system 1 on a real-time basis during the driving of motor vehicle 3 by using wireless communication unit 39. The battery data include the voltages, currents, temperatures, SOCs, and SOHs of cells E1 to En. Vehicle control unit 30 samples these data periodically (for example, at intervals of 10 seconds) and transmits the data to battery abnormality prediction system 1 every time the sampling is performed.

Vehicle control unit 30 may accumulate the battery data of motor vehicle 3 in an internal memory and collectively transmit the battery data accumulated in the memory at a predetermined timing. For example, vehicle control unit 30 collectively transmits the battery data accumulated in the memory to a terminal device in an office after the completion of the day's work. The terminal device in the office transmits the battery data of a plurality of motor vehicles 3 to battery abnormality prediction system 1 at a predetermined timing.

Alternatively, vehicle control unit 30 may collectively transmit the battery data accumulated in the memory to charging adapter 6 or charger 4 having a network communication function via the charging cable at the time of charging by charger 4. Charging adapter 6 or charger 4 having the network communication function transmits the received battery data to battery abnormality prediction system 1. This example is effective for motor vehicle 3 not having a wireless communication function.

Figure 3:
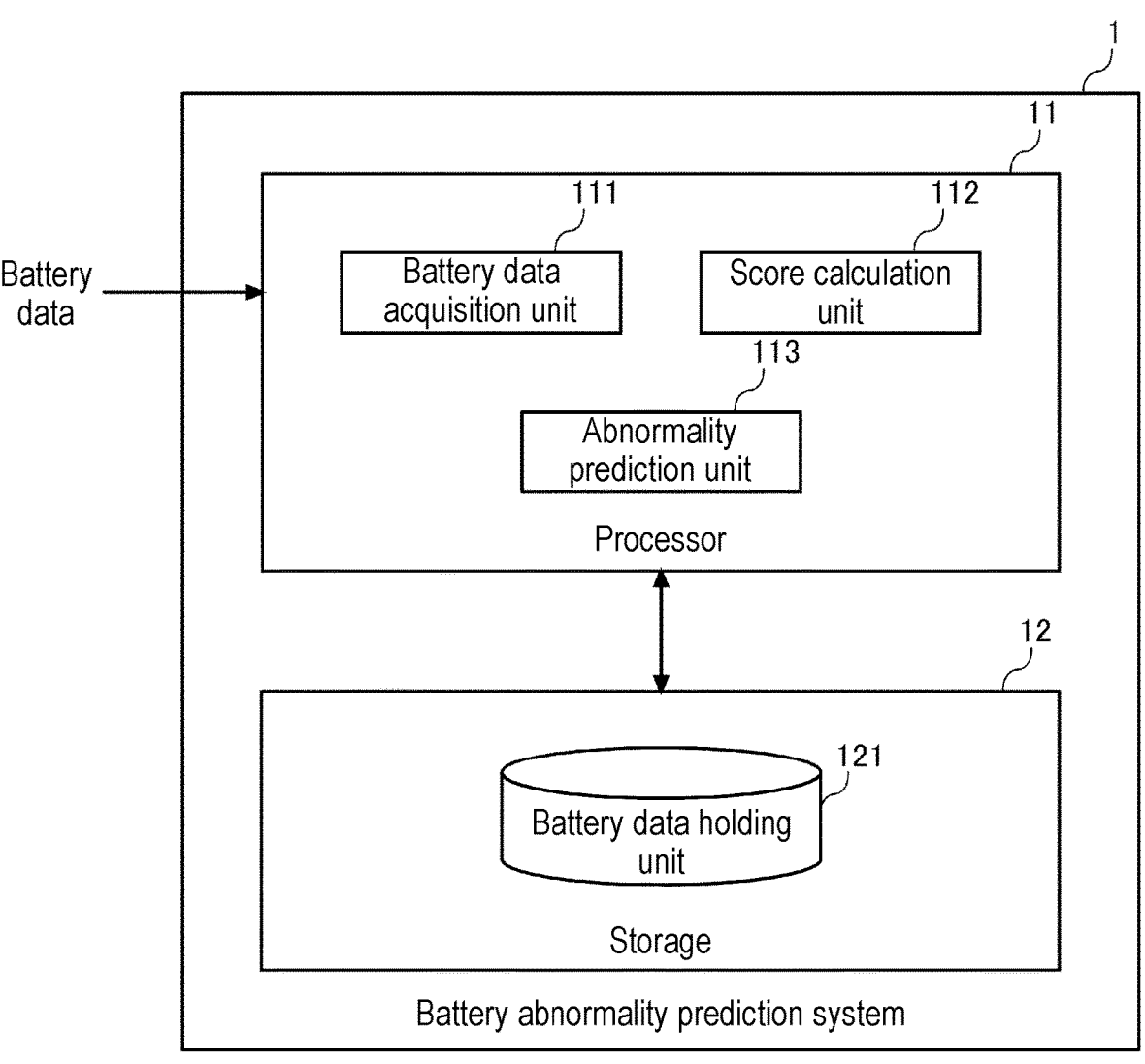
FIG. 3 is a diagram illustrating a configuration example of a battery abnormality prediction system according to the embodiment.

FIG. 3 is a diagram illustrating a configuration example of battery abnormality prediction system 1 according to the embodiment. Battery abnormality prediction system 1 includes processor 11 and storage 12. Processor 11 includes battery data acquisition unit 111, score calculation unit 112, and abnormality prediction unit 113. The function of processor 11 can be realized by a combination of a hardware resource and a software resource or only by a hardware resource. Examples of the hardware resource that can be used include CPU, ROM, RAM, a graphics processing unit (GPU), an application specific integrated circuit (ASIC), a field programmable gate array (FPGA), and other LSIs. Examples of the software resource that can be used include programs such as an operating system and an application.

Storage 12 includes battery data holding unit 121. Storage 12 includes a nonvolatile recording medium, such as a hard disk drive (HDD) or a solid state drive (SSD), and records various data.

Battery data acquisition unit 11 acquires battery data from motor vehicle 3, charger 4, or charging adapter 6 via network 2. In the present embodiment, the battery data to be acquired needs to include at least current and temperature.

Score calculation unit 112 calculates a determination score for detecting a sign of fire during charging, based on the current and temperature of each of cells E1 to En and an elapsed time. The determination score is calculated based on a thermal energy theory.

A self-heat generation amount owing to a charging current is defined by Q (I, R, T).

Q: heat generation amount [J], I: current [A], R: internal resistance [Ω], T: elapsed time [s]

When the current I is larger, the internal resistance R is higher, or the elapsed time T is longer, the self-heat generation amount Q owing to a charging current is larger.

Note that the internal resistance R of a battery depends on SOC, temperature, and SOH. When an SOC is higher, a temperature is lower, or an SOH is lower, the internal resistance R is higher.

The heat generation amount of a battery is defined by Q (m, c, ΔTp).

Q: heat generation amount [J], m: battery mass [g], c: specific heat of the entirety of battery [J/(g·K)], ΔTp: temperature rise [° C.] for a period of time T m and c can be correctively regarded as heat capacity C: [J/K].

When the heat capacity C is larger or the temperature rise ΔTp during the elapsed time T is larger, the heat generation amount Q of a battery is larger.

When the self-heat generation amount Q owing to a charging current is equal to or smaller than the heat generation amount Q of the battery, thermal runaway caused by self-heat generation can be prevented. However, the battery data acquired by battery data acquisition unit 111 basically do not include the material, mass, and internal resistance of each of cells E1 to En.

Score calculation unit 112 calculates a determination score indicating a relationship between the amount of a current flowing through each of cells E1 to En for a certain period of time and a rise in the temperature of each of cells E1 to En for the certain period of time. The determination score is calculated from the current I, the temperature rise Tp, and the elapsed time T without using the internal resistance and heat capacity of each of cells E1 to En. For example, the determination score may be defined by the ratio of an integrated amount of current to the temperature rise during the certain period of time. In this example, when the temperature rise is larger for a charging current, the determination score is higher based on the integrated amount of current, whereas the determination score is lower based on the temperature rise.

Abnormality prediction unit 113 compares the determination score calculated by score calculation unit 112 with a threshold determined based on the data of a battery having caught fire and thereby predicts the occurrence of an abnormality in each of cells E1 to En.

Figure 4A:
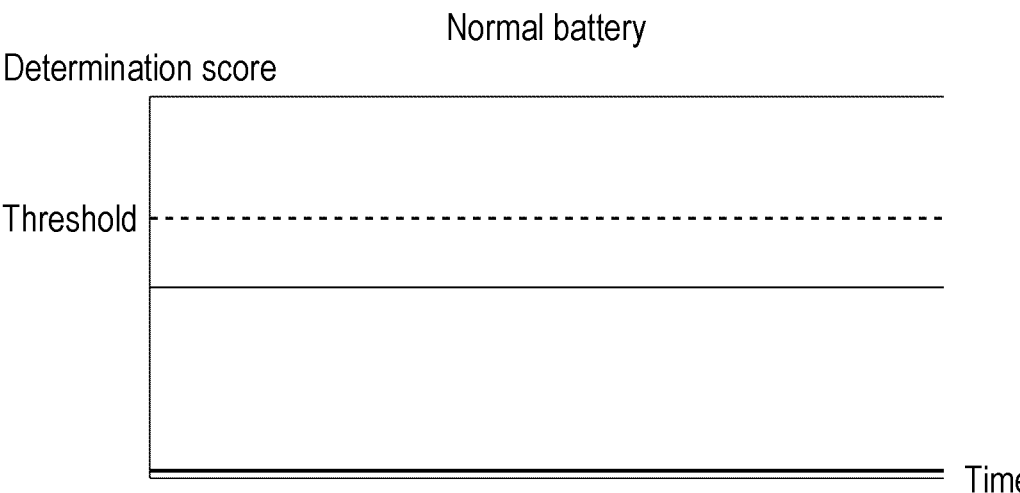
FIG. 4A is a diagram illustrating an example of variations in the determination scores of a normal battery during charging.
Figure 4B:
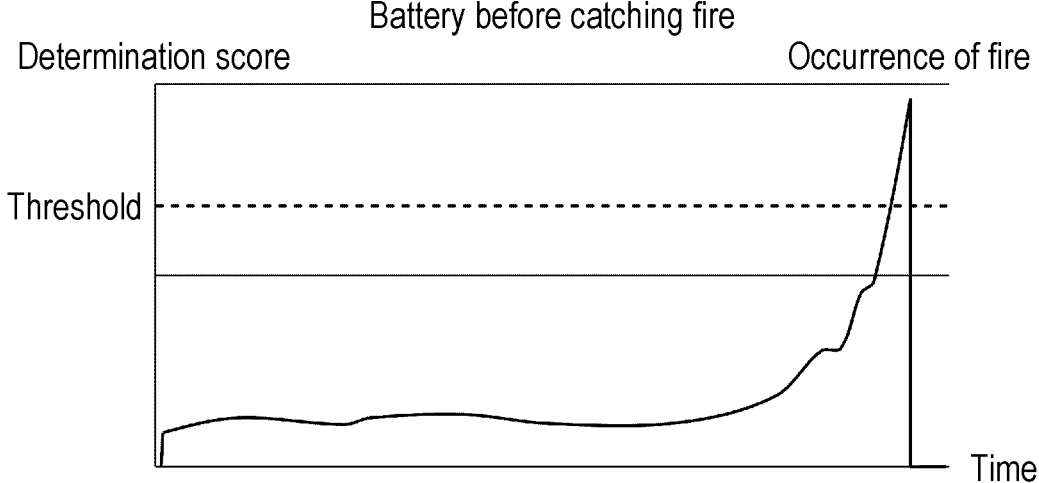
FIG. 4B is a diagram illustrating an example of variations in the determination scores of in the determination scores of a battery during charging before the battery catches fire.

FIG. 4A and FIG. 4B are diagrams respectively illustrating an example of variations in determination scores of a normal battery and an example of variations in determination scores of a battery during charging before the battery catches fire. In FIG. 4B, variations in determination scores of a battery having actually caught fire are illustrated. The variations in the determination scores of the battery having caught fire are based on actual data collected from motor vehicle 3. To increase the number of data, variations in determination scores of the battery having caught fire, based on an experiment or a simulation, may be included.

When a minor abnormality occurs, a peak appears every time charging is performed, resulting in fire. When exceeding a threshold occurs once or two or more times, it is determined that an abnormality has occurred. The designer determines the threshold, based on data on variations in determination scores of at least one battery having caught fire. In the case where data on variations in determination scores of a plurality of batteries having caught fire are collected, the data on the variations in the determination scores are combined to generate standard data, and the threshold is determined based on the standard data.

The threshold is set at a value of a determination score obtained before the battery catches fire. In the example illustrated in FIG. 4B, determination scores are based on an integrated amount of current, and hence the threshold is set at a value lower by a predetermined margin than a determination score obtained at the time of occurrence of a fire. Note that, in the case of using a determination score based on the temperature rise, the threshold is set at a value higher by the predetermined margin than the determination score at the time of occurrence of the fire. The predetermined margin is set at a value enough to secure a time in which a fire-sign signal can be transmitted from battery abnormality prediction system 1 to motor vehicle 3 and thereby battery management unit 42 can interrupt a current.

The determination score reflects a temperature rise due to external factors, such as a cooling system trouble, other than a temperature rise due to self-heat generation. Vehicles of the same type often use the same battery type and battery model number, the same configuration of a battery pack, and the same configuration of a cooling system. The designer may collect data on variations in determination scores of batteries having caught fire on a vehicle type basis and determine the threshold on a vehicle type basis.

The same battery type basically leads to the same active material and the same voltage, so that batteries are closer in heat capacity and internal resistance. The designer may collect data on variations in determination scores of batteries having caught fire on a vehicle type basis and determine the threshold on a vehicle type basis. For example, the designer may determine the threshold for lithium-ion batteries and the threshold for nickel-metal hydride batteries, separately.

When a battery is used in an area with higher temperatures, the battery receives higher heat from the outside. The designer may collect data on variations in determination scores of batteries having caught fire in every area and determine the threshold for every area. For example, the designer may determine the threshold for a cold climate area and the threshold for a warm climate area, separately.

When a determination score calculated by score calculation unit 112 exceeds the threshold once or two or more times, abnormality prediction unit 113 transmits a fire-sign signal to charging adapter 6 via network 2. Upon receipt of the fire-sign signal via charging adapter 6, vehicle control unit 30 or battery control unit 46 turns off second relay RY2 or a protective relay (not illustrated) in battery module 41 to interrupt a current.

Figure 5:
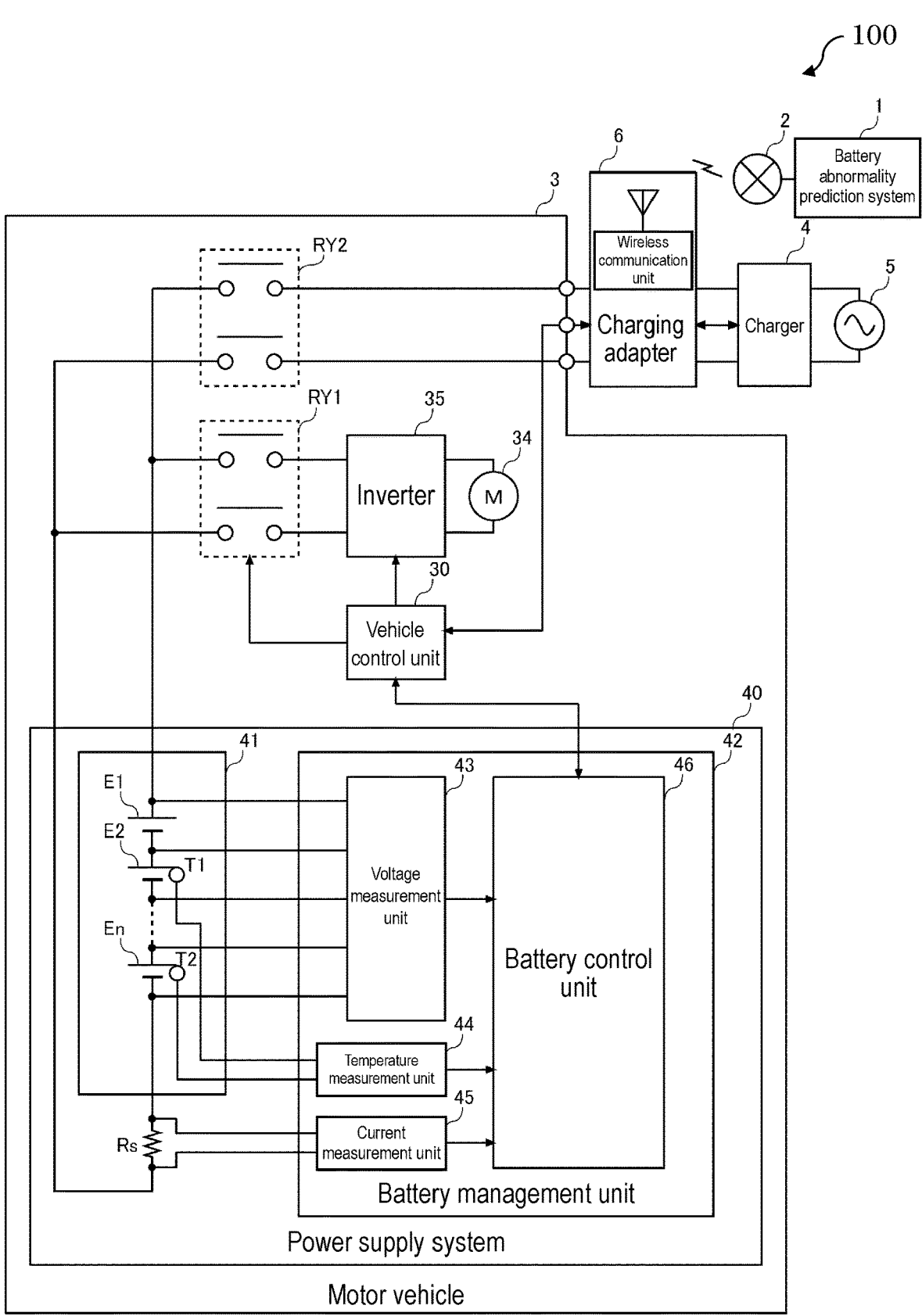
FIG. 5 is a diagram of a modification of the battery abnormality prediction notification system according to the embodiment.

Hereinafter, a modification of battery abnormality prediction notification system 100 according to the embodiment will be described. FIG. 5 is a diagram illustrating a configuration example in which charging adapter 6 includes wireless communication unit 36. When a determination score calculated by score calculation unit 112 exceeds the threshold, abnormality prediction unit 113 transmits a fire-sign signal to charging adapter 6 via network 2. Upon receipt of the fire-sign signal, charging adapter 6 transmits a trigger signal to vehicle control unit 30 or battery control unit 46 via a communication line in a charging cable. Upon receipt of the trigger signal, vehicle control unit 30 turns off second relay RY2 to interrupt a current. Upon receipt of the trigger signal, battery control unit 46 turns off a protective relay (not illustrated) disposed in battery module 41 to interrupt a current.

Figure 6:
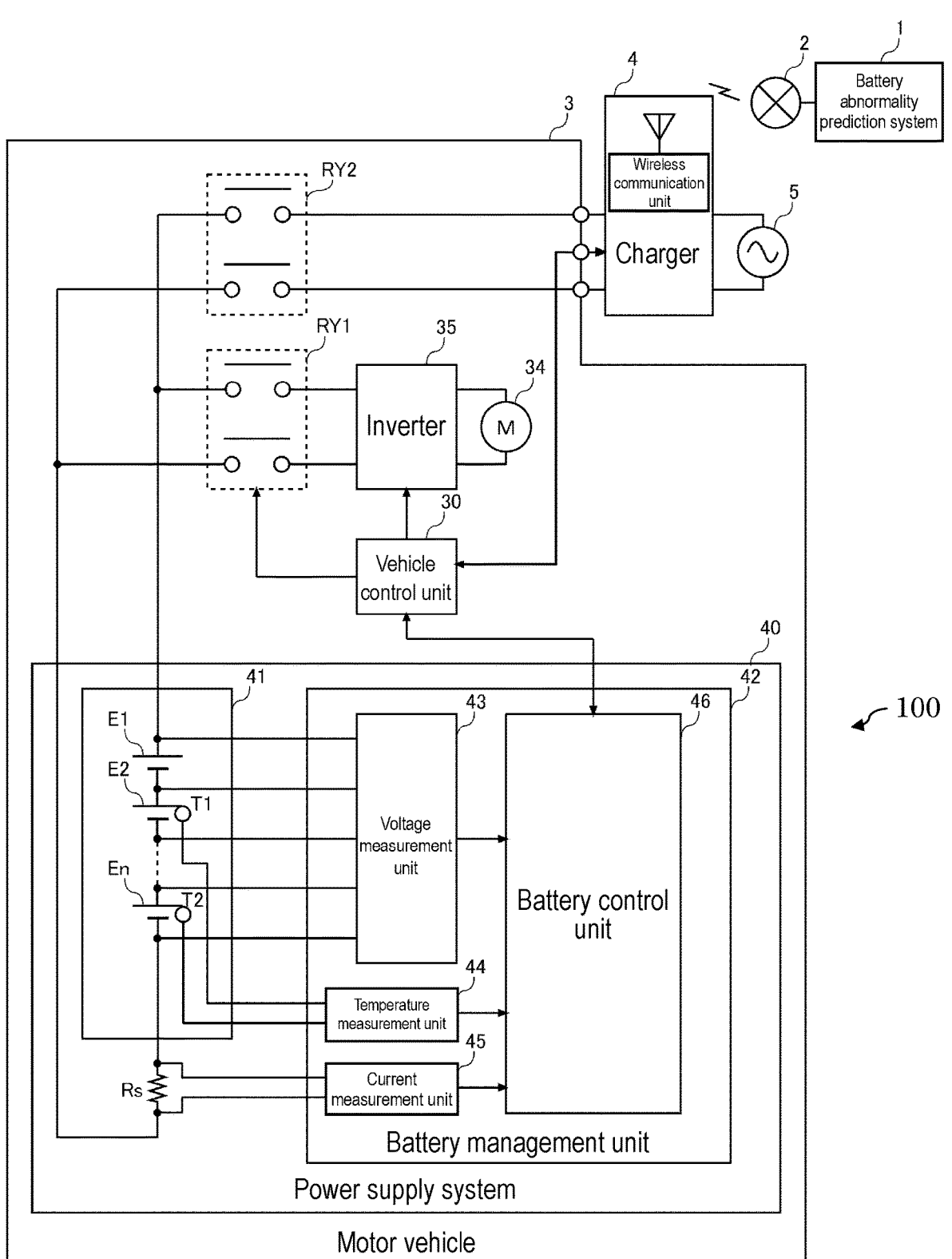
FIG. 6 is a diagram of a modification of the battery abnormality prediction notification system according to the embodiment.

FIG. 6 is a diagram illustrating a configuration example in which charger 4 includes wireless communication unit 36. When a determination score calculated by score calculation unit 112 exceeds the threshold, abnormality prediction unit 113 transmits a fire-sign signal to charger 4 via network 2. Upon receipt of the fire-sign signal, charger 4 transmits a trigger signal to vehicle control unit 30 or battery control unit 46 via a communication line in a charging cable. Upon receipt of the trigger signal, vehicle control unit 30 turns off second relay RY2 to interrupt a current. Upon receipt of the trigger signal, battery control unit 46 turns off a protective relay (not illustrated) disposed in battery module 41 to interrupt a current.

Figure 7:
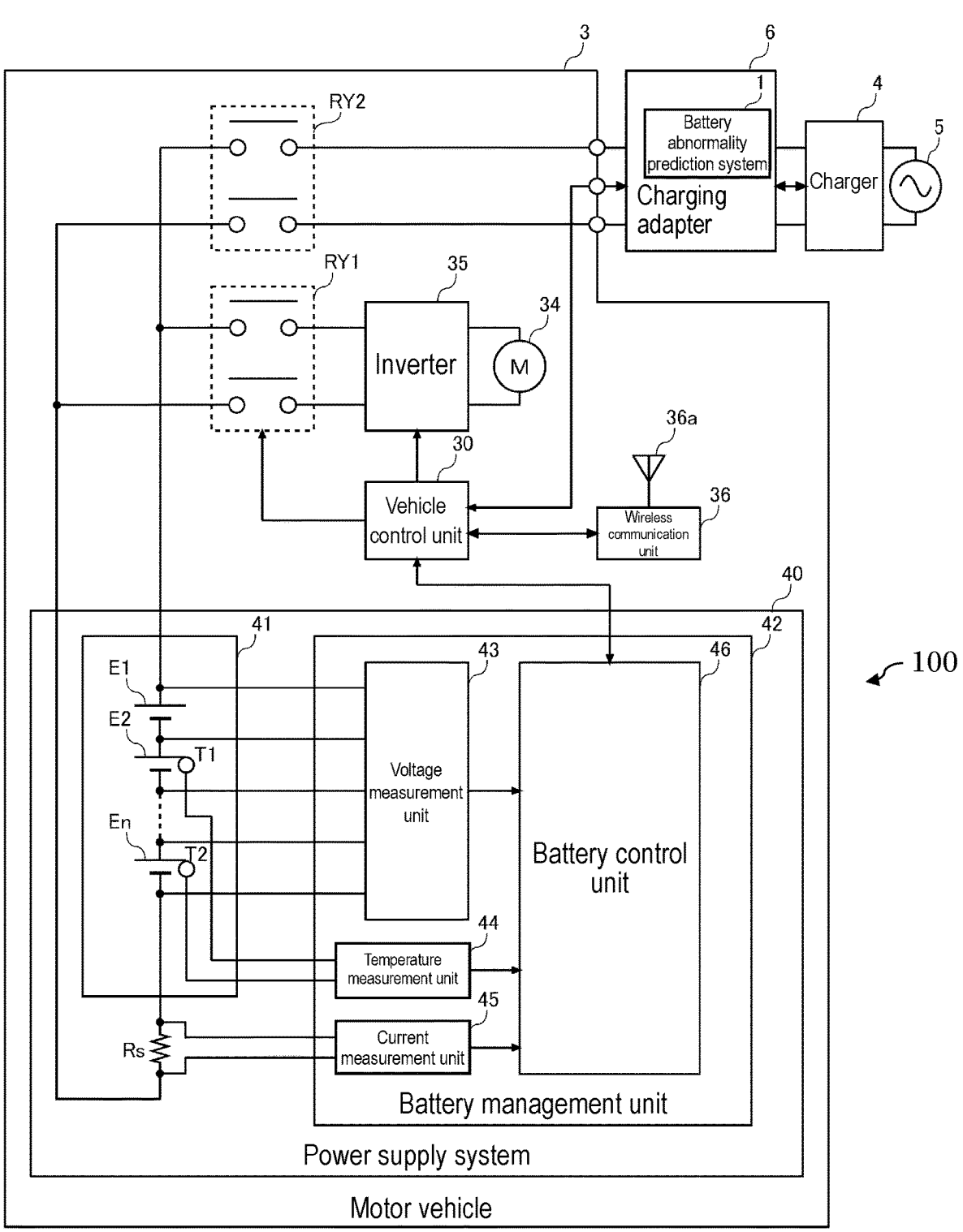
FIG. 7 is a diagram of a modification of the battery abnormality prediction notification system according to the embodiment.

FIG. 7 is a diagram illustrating a configuration example in which charging adapter 6 includes a battery abnormality prediction system. When a determination score calculated by score calculation unit 112 exceeds the threshold, abnormality prediction unit 113 transmits a fire-sign signal to vehicle control unit 30 or battery control unit 46 via a communication line in a charging cable. Upon receipt of the trigger signal, vehicle control unit 30 turns off second relay RY2 to interrupt a current. Upon receipt of the trigger signal, battery control unit 46 turns off a protective relay (not illustrated) disposed in battery module 41 to interrupt a current.

Figure 8:
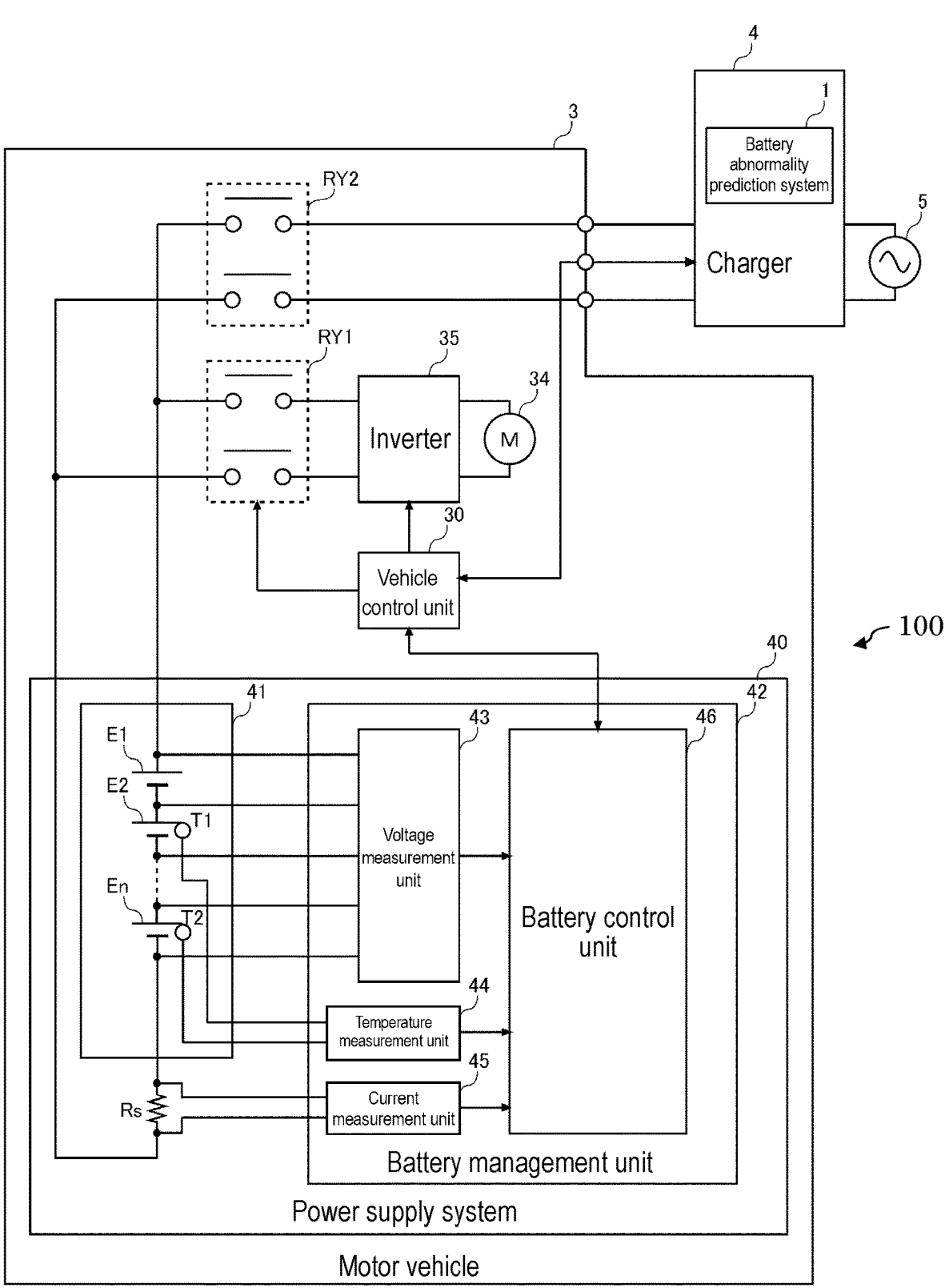
FIG. 8 is a diagram of a modification of the battery abnormality prediction notification system according to the embodiment.

FIG. 8 is a diagram illustrating a configuration example in which charger 4 includes a battery abnormality prediction system. When a determination score calculated by score calculation unit 112 exceeds the threshold, abnormality prediction unit 113 transmits a fire-sign signal to vehicle control unit 30 or battery control unit 46 via a communication line in a charging cable. Upon receipt of the trigger signal, vehicle control unit 30 turns off second relay RY2 to interrupt a current. Upon receipt of the trigger signal, battery control unit 46 turns off a protective relay (not illustrated) disposed in battery module 41 to interrupt a current.

Figure 9:
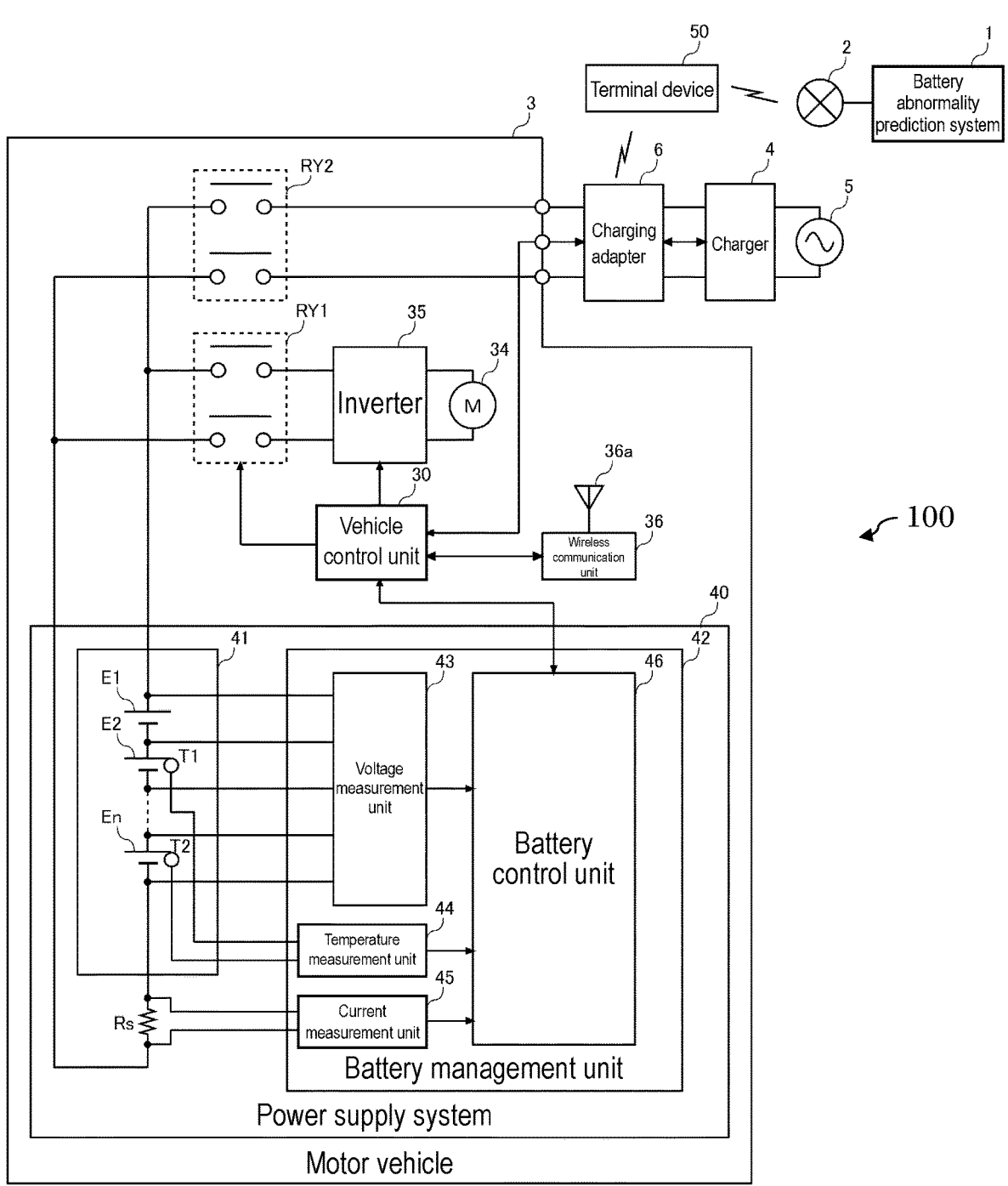
FIG. 9 is a diagram of a modification of the battery abnormality prediction notification system according to the embodiment.

FIG. 9 is a diagram illustrating a configuration example in which a terminal operator makes an inquiry to battery abnormality prediction system 1 via terminal device 50 to check if a fire-sign state has arisen. When a determination score calculated by score calculation unit 112 exceeds the threshold, abnormality prediction unit 113 determines that a fire-sign state has arisen. Terminal device 50 accesses battery abnormality prediction system 1 via network 2, whereby the terminal operator can confirm whether abnormality prediction unit 113 has determined, based on the determination score, that a battery as a monitoring target is in the fire-sign state. Specifically, when battery abnormality prediction system 1 is accessed from terminal device 50, battery abnormality prediction system 1 transmits, to terminal device 50, the fire-sign state determined based on a determination score or variations in determination scores. The terminal operator can confirm, on a display (not illustrated) of terminal device 50, an error code or an error message indicating the fire-sign state determined based on the determination score or the variations in determination scores.

As described above, according to the present embodiment, a sign of fire to be caught by a battery can be detected early. In the present embodiment, not only a temperature rise but also a current are taken into account, whereby a sign of fire with a slow rise rate of temperature can be also detected. In other words, the type of a sign of fire in which a charging current is not large and a temperature rise is slow can be also detected. Thus, a sign of fire can be detected without depending on charging patterns.

In the case of motor vehicle 3, a charging pattern of boosting charging and a charging pattern of normal charging are different. Furthermore, charging patterns are different also depending on the type of charger 4. As described above, in the present embodiment, a sign of fire can be detected without depending on charging patterns.

In the present embodiment, a determination score is calculated all the time, based on a current, an elapsed time, and a temperature. In the above-mentioned Patent Literature 1, abnormalities are determined at every predetermined timing. In the present embodiment, since the determination score is calculated all the time, an abnormality can be detected without being limited by a determination timing.

Furthermore, in the above-mentioned Patent Literature 1, a threshold of a temperature difference or a temperature rise rate is determined, based on a specific charging pattern, and therefore, when charging with a charging pattern different from the assumed charging pattern was difficult, an abnormality is difficult to detect. In contrast, in the present embodiment, a sign of fire can be detected without depending on any charge-and-discharge pattern.

In the present embodiment, since a sign of fire can be detected at a stage not accompanying a rapid temperature rise, the sign of fire can be detected at a stage with the minor progression of an abnormality.

Hereinbefore, the present disclosure has been described based on the embodiment. Persons skilled in the art understand that the embodiment is merely an example, and various modifications can be made to combinations of the constituents or combinations of the treatment processes, and such modifications are also included within the scope of the present disclosure.

In the embodiment, there has been described an example in which a sign of fire to be caught by cells E1 to En installed in motor vehicle 3 is detected by battery abnormality prediction system 1 connected to network 2. In this term, battery abnormality prediction system 1 may be incorporated in battery control unit 46.

In this case, a battery to be used is specified, and therefore, battery control unit 46 may calculate the threshold as occasion arises, based on a C rate during charging and an allowable temperature rise per unit time in charging at the C rate.

Battery abnormality prediction system 1 may be incorporated in charger 4 or charging adapter 6. In this case, a battery to be charged is not specified, and therefore, the threshold is determined based on data on batteries having caught fire.

Battery abnormality prediction system 1 according to the present disclosure is also applicable to a secondary battery other than the secondary battery installed in motor vehicle 3. In particular, there is a possibility that a secondary battery to be installed in a portable apparatus is charged by a charger different from a charger usually used. For example, battery abnormality prediction system 1 according to the present disclosure is also applicable to a secondary battery installed in an electric motor ship, a multicopter (drone), an electric motorbike, an electric-assisted bicycle, a smart phone, a tablet, a notebook PC, or the like.

In battery abnormality prediction notification system 100 according to the present disclosure, a terminal operator checks, via terminal device 50, whether battery module 41 of motor vehicle 3 is in a fire-sign state. When battery module 41 is in the fire-sign state, an alarm message is displayed on terminal device 50. Thus, inspection and maintenance can be carried out before battery module 41 catches fire. Alternatively, a person in charge of the management of a vehicle checks, via terminal device 50, whether battery module 41 of motor vehicle 3 is in a fire-sign state, whereby an operation and maintenance plan for motor vehicle 3 can be formulated.

Note that the embodiment may be specified by the following items.

[Item 1]

A battery abnormality prediction system (1) including:

an acquisition unit (111) configured to acquire a current flowing through a battery (E1) and a temperature of the battery (E1); and a prediction unit (113) configured to predict the occurrence of an abnormality in the battery (E1), based on a relationship between the amount of the current flowing through the battery (E1) for a certain period of time and a rise in the temperature of the battery (E1) for the certain period of time.

Thus, a sign of abnormal heat generation in the battery (E1) can be early detected.

[Item 2]

The battery abnormality prediction system (1) according to Item 1, wherein the prediction unit (113) compares the ratio of an integrated amount of current to the temperature rise for the certain period of time with a threshold determined based on data on batteries (E1) having caught fire and thereby detects a sign of fire to be caught by the battery (E1).

Thus, a sign of fire to be caught by the battery (E1) can be early detected.

[Item 3]

The battery abnormality prediction system (1) according to Item 1 or 2, wherein the battery (E1) is a secondary battery (E1) installed in a motor vehicle (3), and the acquisition unit (111) acquires a current and a temperature of the secondary battery (E1) installed in the motor vehicle (3).

Thus, a sign of abnormal heat generation in the secondary battery (E1) installed in the motor vehicle (3) can be early detected.

[Item 4]

The battery abnormality prediction system (1) according to Item 2, wherein the battery (E1) is a secondary battery (E1) installed in a motor vehicle, the acquisition unit (111) acquires a current and a temperature of the secondary battery (E1) installed in the motor vehicle (3) via a network (2), and the threshold is determined on a vehicle type basis.

Thus, a sign of fire to be caught by the secondary battery (E1) installed in the motor vehicle (3) can be detected with higher precision.

[Item 5]

A battery abnormality prediction method, including:

acquiring a current flowing through a battery (E1) and a temperature of the battery (E1); and predicting the occurrence of an abnormality in the battery (E1), based on a relationship between the amount of the current flowing through the battery (E1) for a certain period of time and a rise in the temperature of the battery (E1) for the certain period of time.

Thus, a sign of abnormal heat generation in the battery (E1) can be early detected.

[Item 6]

A battery abnormality prediction program that causes a computer to execute processing to acquire a current flowing through a battery (E1) and a temperature of the battery (E1), and processing to predict the occurrence of an abnormality in the battery (E1), based on a relationship between the amount of the current flowing through the battery (E1) for a certain period of time and a rise in the temperature of the battery (E1) for the certain period of time.

Thus, a sign of abnormal heat generation in the battery (E1) can be early detected.

REFERENCE MARKS IN THE DRAWINGS

1 . . . battery abnormality prediction system
2 . . . network
3 . . . motor vehicle
4 . . . charger
5 . . . commercial power system
6 . . . charging adapter
11 . . . processor
111 . . . battery data acquisition unit
112 . . . score calculation unit
113 . . . abnormality prediction unit
12 . . . storage
121 . . . battery data holding unit
30 . . . vehicle control unit 34 . . . motor
35 . . . inverter
36 . . . wireless communication unit
36a . . . antenna
40 . . . power supply system
41 . . . battery module
42 . . . battery management unit
43 . . . voltage measurement unit
44 . . . temperature measurement unit
45 . . . current measurement unit
46 . . . battery control unit
E1 to En . . . cell
RY1 . . . first relay
RY2 . . . second relay
T1 . . . first temperature sensor
T2 . . . second temperature sensor
Rs . . . shunt resistance

What is claimed is:

1. A battery abnormality prediction system, comprising:
one or more memories; and
at least one processor each coupled to at least one of the one or more memories and configured to perform operations comprising:
acquiring a current flowing through a secondary battery to be installed in a portable apparatus and a temperature of the secondary battery;
predicting occurrence of an abnormality in the secondary battery, as a determination score, based on a relationship between an amount of the current flowing through the secondary battery for a certain period of time and a rise in temperature of the secondary battery for the certain period of time;
detecting a sign of a potential fire to be caught by the secondary battery by comparing the determination score indicating a relationship between the amount of the current and the rise in temperature for the certain period of time with a threshold determined based on data on a secondary battery that caught fire; and
interrupting the current flowing through the secondary battery to be installed in the portable apparatus in response to detecting the sign of the potential fire.

2. The battery abnormality prediction system according to claim 1,
wherein the determination score is defined by a ratio of an integrated amount of current to the rise in temperature for the certain period of time.

3. The battery abnormality prediction system according to claim 2, wherein
the portable apparatus is a motor vehicle.

4. The battery abnormality prediction system according to claim 3, further comprising:
a charger configured to charge the secondary battery.

5. The battery abnormality prediction system according to claim 3, further comprising:
a charger configured to charge the secondary battery and
a charging adapter configured to conduct electric power between the charger and the secondary battery.

6. A battery abnormality prediction notification system, comprising the motor vehicle and the battery abnormality prediction system according to claim 3, wherein
the motor vehicle further includes:
a vehicle control unit configured to control the motor vehicle; and
a battery control unit configured to control charging of the secondary battery, and a fire-sign signal indicating the sign of the potential fire to be caught by the battery is transmitted to the vehicle control unit or the battery control unit.

7. The battery abnormality prediction notification system according to claim 6, further comprising:
a charger configured to charge the secondary battery installed in the motor vehicle, wherein the charger receives data from a network, and
the fire-sign signal is transmitted to the vehicle control unit or the battery control unit via the charger.

8. The battery abnormality prediction notification system according to claim 7, wherein
the motor vehicle further includes:
a power system; and
a relay configured to conduct or interrupt a current between the secondary battery and the power system, and
the interrupting the current flowing through the secondary battery comprises receiving, by the vehicle control unit, the fire-sign signal and causing, by the vehicle control unit, the relay to interrupt the current between the secondary battery and the power system.

9. The battery abnormality prediction notification system according to claim 6, further comprising:
a charger configured to charge the secondary battery; and
a charging adapter configured to conduct electric power between the charger and the secondary battery,
wherein the charging adapter receives data from a network, and
the fire-sign signal is transmitted to the vehicle control unit or the battery control unit via the charging adapter.

10. The battery abnormality prediction system according to claim 1, wherein
the secondary battery is installed in a motor vehicle, and
the operations comprise acquiring, via a network, a current and a temperature of the secondary battery installed in the motor vehicle.

11. The battery abnormality prediction system according to claim 10, wherein the threshold is determined on a vehicle type basis.

12. A battery abnormality prediction notification system, comprising the battery abnormality prediction system according to claim 10, wherein,
when the battery abnormality prediction system is accessed from a terminal device via the network, a result of comparing the ratio of the integrated amount of current to the rise in temperature for the certain period of time with the threshold determined based on the data on the battery that caught fire is transmitted.

13. The battery abnormality prediction notification system according to claim 12, wherein,
on receipt of the result, the terminal device provides an indication corresponding to the result.

14. The battery abnormality prediction notification system according to claim 12 wherein,
the indication provided by the terminal device is an error code or an error message, the error code or the error message indicating a fire-sign state of the secondary battery.

15. A battery abnormality prediction method, comprising:
acquiring a current flowing through a secondary battery to be installed in a portable apparatus and a temperature of the secondary battery;
predicting occurrence of an abnormality in the secondary battery, as a determination score, based on a relationship between an amount of the current flowing through the secondary battery for a certain period of time and a rise in temperature of the secondary battery for the certain period of time;

detecting a sign of a potential fire to be caught by the secondary battery by comparing a determination score indicating a relationship between the amount of the current and the rise in temperature for the certain period of time with a threshold determined based on data on a secondary battery that caught fire; and interrupting the current flowing through the secondary battery to be installed in the portable apparatus in response to detecting the sign of the potential fire.

16. The battery abnormality prediction method according to claim 15, wherein a motor vehicle includes:

a vehicle control unit configured to control the motor vehicle; and a battery control unit configured to control charging of the battery, the battery abnormality prediction method further comprises notifying the vehicle control unit or the battery control unit of occurrence of the abnormality in the battery.

17. A non-transitory recording medium storing a battery abnormality prediction program, the battery abnormality prediction program causing a computer to execute:

processing to acquire a current flowing through a secondary battery and a temperature of the secondary battery;

processing to predict occurrence of an abnormality in the secondary battery, as the determination score, based on a relationship between an amount of the current flowing through the secondary battery for a certain period of time and a rise in temperature of the secondary battery for the certain period of time;

processing to detect a sign of a potential fire to be caught by the secondary battery by comparing a determination score indicating a relationship between the amount of the current and the rise in temperature for the certain period of time with a threshold determined based on data on a secondary battery that caught fire; and processing to interrupt the current flowing through the secondary battery in response to detecting the sign of the potential fire.

18. The non-transitory recording medium storing the battery abnormality prediction program according to claim 17, wherein a motor vehicle includes:

a vehicle control unit configured to control the motor vehicle; and a battery control unit configured to control charging of the battery, and the battery abnormality prediction program further causes the computer to execute processing to notify the vehicle control unit or the battery control unit of occurrence of the abnormality in the battery.

* * * * *